(12) United States Patent
Peng et al.

(10) Patent No.: US 7,785,126 B2
(45) Date of Patent: Aug. 31, 2010

(54) REINFORCED BACKPLATE FOR USE WITH ELECTRICAL CONNECTOR ASSEMBLY HAVING INSULATIVE COATING THEREON

(75) Inventors: Fu-Jin Peng, Shenzhen (CN); Been-Yang Liaw, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/471,497

(22) Filed: May 26, 2009

(65) Prior Publication Data

US 2010/0029120 A1 Feb. 4, 2010

(51) Int. Cl.
*H01R 13/62* (2006.01)

(52) U.S. Cl. .......................... 439/331; 439/71

(58) Field of Classification Search ............... 439/331, 439/330, 70, 71
See application file for complete search history.

(56) References Cited

U.S. PATENT DOCUMENTS

| 6,061,239 | A | 5/2000 | Blomquist |
| 7,190,584 | B2 | 10/2005 | Lee et al. |
| 7,001,197 | B2 | 2/2006 | Shirai et al. |
| 7,217,149 | B2 | 5/2006 | Ma |
| 7,433,194 | B2 | 6/2008 | Wu et al. |
| 2006/0057878 | A1* | 3/2006 | Szu ........................ 439/331 |
| 2006/0141840 | A1* | 6/2006 | Ma ........................ 439/331 |
| 2006/0199413 | A1* | 9/2006 | Ju ........................ 439/331 |
| 2006/0216982 | A1* | 9/2006 | Ishida ................... 439/331 |

* cited by examiner

*Primary Examiner*—Hien Vu
(74) *Attorney, Agent, or Firm*—Andrew C. Cheng; Wei Te Chung; Ming Chieh Chang

(57) ABSTRACT

A connector assembly includes a PCB, an insulative housing mounted on the PCB with a plurality of contacts received therein, a retention module mounted on the PCB and surrounding the insulative housing, and a backplate mounted below the PCB for reinforcing the retention module. The backplate includes a base plate having an upper surface toward a backside surface of the PCB and an insulative coating deposited on the upper surface to prevent the backplate from short-circuiting electrical components of mounted on the backside surface of the PCB.

3 Claims, 4 Drawing Sheets

REINFORCED BACKPLATE FOR USE WITH ELECTRICAL CONNECTOR ASSEMBLY HAVING INSULATIVE COATING THEREON

BACKGROUND OF THE INVENTION

1. Field of the Invention

The present invention relates to a backplate, and more particularly to a backplate disposed on a backside of a printed circuit board for mounting a retention module disposed on the other side of the printed circuit board thereon. The backplate is featured with a robust coating thereon so as to provide durable insulative layer to prevent short circuiting of electrical components disposed on the printed circuit board.

2. Description of the Related Art

Center processing unit (CPU) sockets are mounted on motherboards and hold CPUs for execution of programs, and Intel Corp has designed and introduced a new CPU which is supported by a so-called LGA775 socket which is generally soldered onto a printed circuit board to support CPU and then makes electrical interconnections between the CPU and the printed circuit board.

During the operation of the CPU, a great deal of heat is generated and has to be dissipated efficiently and quickly during the operation of a computer device. In the past, a heatsink is introduced and includes a base plate with a plurality of fins extending therefrom. In use, the base plate of the heatsink is directly in contact with an upper surface of the CPU so as to dissipate the heat generated thereof. U.S. Pat. No. 6,061,239 issued to Blomquist on May 9, 2000 discloses a clip used to attach the heatsink to the CPU. The Blokquist clip is generally clipped onto the socket directly.

However, when the performance of the CPU becomes more and more powerful, the heatsink becomes larger and larger as well. Normally, the heatsink is about double to the dimension of the CPU. As a result, it is unlikely to have the clip engage with the socket.

When the 775 socket was introduced, the socket is provided with a stiffener, see also U.S. Pat. No. 7,001,197 issued to Shriai et al on Feb. 21, 2006, specially FIGS. 24A~24B, and 25. Generally, the CPU is sandwiched between an element 508 and element 510. While FIG. 25 illustrates how a heatsink is used to dissipate the heat generated thereof.

U.S. Pat. No. 7,190,584 issued to Lee on Mar. 13, 2007 describes a typical retention module used to hold down a heatsink in close contact with the CPU, see FIGS. 5 and 6.

In order to properly support the retention module, a back plate element is introduced, see also U.S. Pat. No. 7,433,194 issued to Wu et al on Oct. 8, 2008. Element 8 in FIG. 2 is used to reinforce the retention module 30.

On the course of development, as disclosed in U.S. Pat. No. 7,217,149 issued to Ma on May 15, 2007, element 3, see FIG. 1 is bolted down to the printed circuit board or a reinforce backplate. Since both the element 3 and heatsink are both bolted onto the backplate, it becomes a vital part in computer device.

In general, the backplate is merely a metallic plate plated with a layer of zinc and nickel, and then covered with an insulative of layer so as to provide an insulative property thereon. The insulative layer will prevent the backplate from short-circuiting electrical components mounted on the backside of the printed circuit board.

The insulative layer could be a film adhered to one side of the metallic plate facing the underside of the printed circuit board. The film can be made from polyethylene terephthalate or polypropylene film with a thickness of one tenth of a centimeter. Since it has to be adhered to the metallic backplate with a strong adhesive, it has to properly and accurately cover all metallic surfaces facing the electronic components.

However, the insulative PET or PE film is not abrasive resistant. It may somehow get a cut or a scratch during the assembling process. This small defect may result an unwanted short-circuiting later on after a period of operation of the computer device. On the other hand, the insulative film is also easily peeled off therefrom, and creating even worse problems.

In view of the above, a new backplate for use with an electrical connector assembly which overcomes the above-mentioned disadvantages is desired.

SUMMARY OF THE INVENTION

Accordingly, an object of the present invention is to provide an electrical connector assembly with a backplate having an insulative coating thereon for preventing the backplate from short-circuiting electrical components mounted on a bottom surface of a printed circuit board.

To achieve the above-mentioned object, an electrical connector assembly in accordance with the present invention, comprises a printed circuit board, an insulative housing mounted upon the printed circuit board and having a receiving cavity for accommodating an IC package, a plurality of contacts disposed in the insulative housing, a retention module surrounding the insulative housing, and a backplate mounted below the printed circuit board for reinforcing the retention module. The retention module is secured on the printed circuit board for restraining the IC package located in the receiving cavity of the insulative housing. The backplate comprises a metallic base plate having a surface towards a backside surface of the printed circuit board and an insulative coating deposited onto the surface of the base plate so as to prevent the backplate from short-circuiting electrical components mounted on the backside surface of the printed circuit board.

Other objects, advantages and novel features of the invention will become more apparent from the following detailed description when taken in conjunction with the accompanying drawings, in which:

DETAILED DESCRIPTION OF PREFERRED EMBODIMENT OF THE INVENTION

Reference will now be made to the drawings to describe the present invention in detail.

Figure 1:
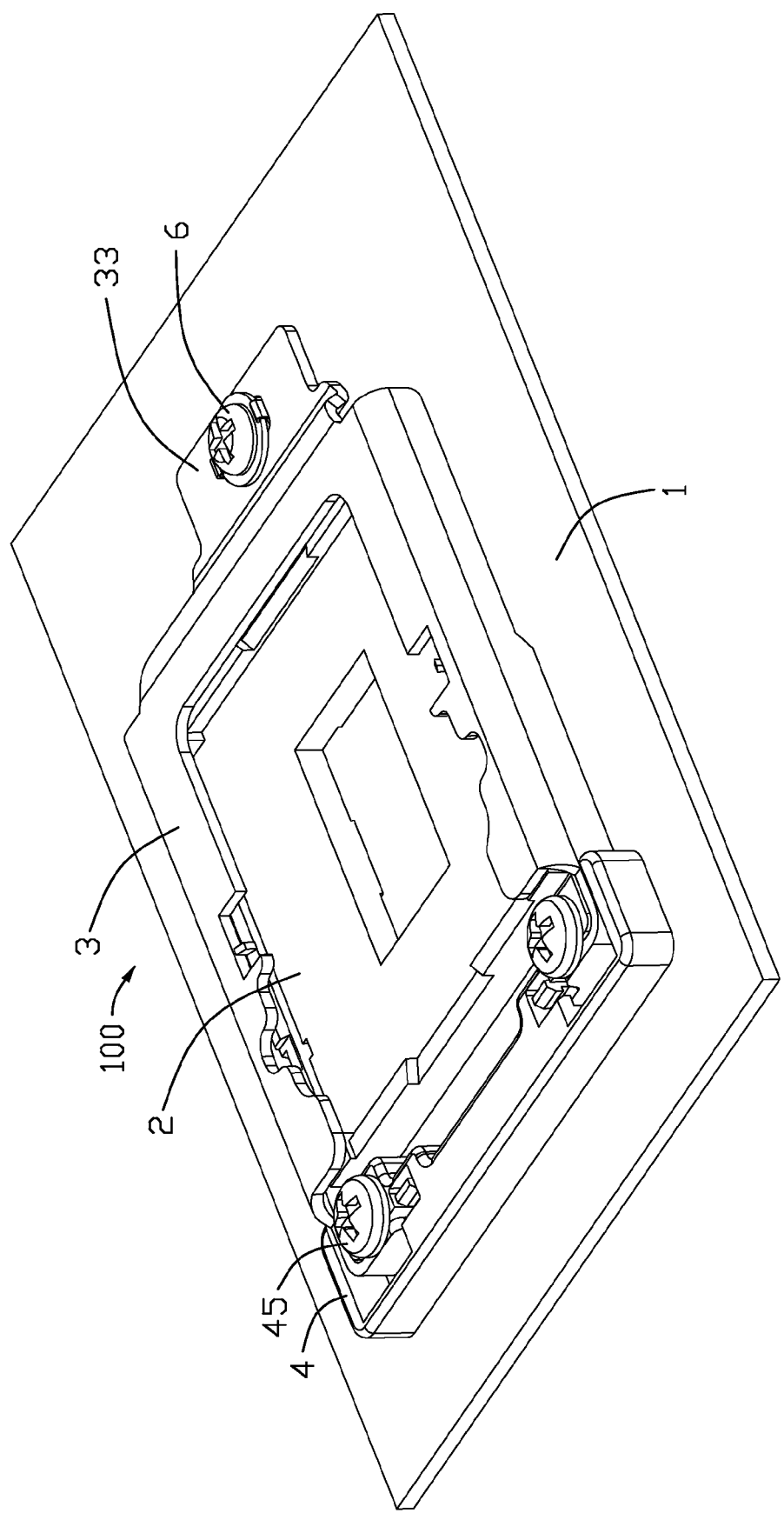
FIG. 1 is an assembled, perspective view of an electrical connector assembly in accordance with a preferred embodiment of the present invention, wherein a cover of the electrical connector assembly is in a close position.
Figure 2:
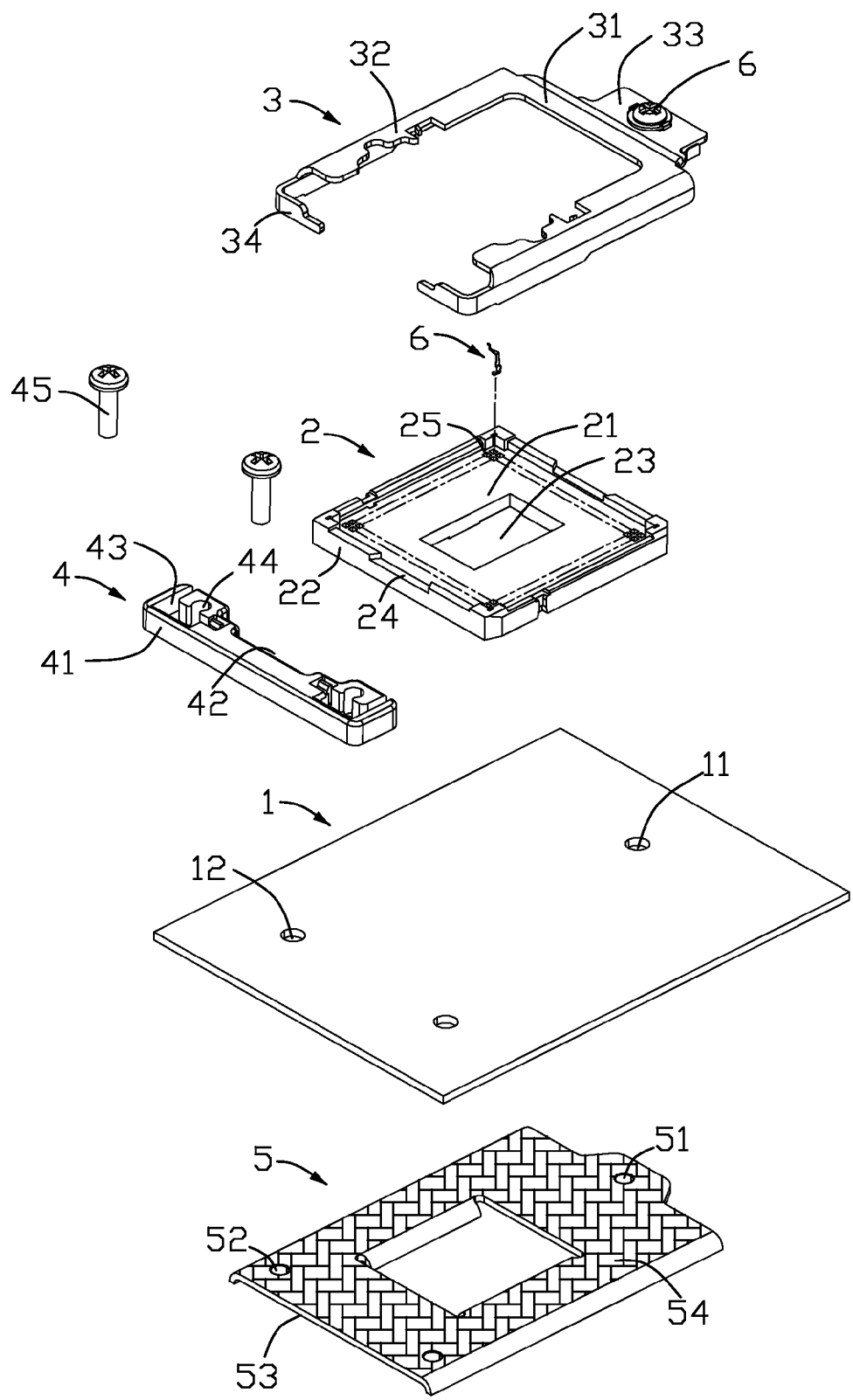
FIG. 2 is an exploded, perspective view of the electrical connector assembly shown in FIG. 1.

Referring firstly to FIGS. 1 and 2, an electrical connector assembly 100 in accordance with a preferred embodiment of the present invention is disclosed for electrically connecting an IC package (not shown). The connector assembly 100 includes a printed circuit board (PCB) 1, an insulative housing 2 mounted upon the PCB 1, a plurality of contacts 6 disposed in the insulative housing 2, a retention module (not labeled) secured on the PCB 1 for restraining the IC package (not shown) in the insulative housing 2 and a backplate 5 mounted below the PCB 1. The retention module includes a holder 4 mounted upon the PCB 1 and beside the insulative housing 2, a cover 3 pivotally mounted on the holder 4 and adapted to cover the insulative housing 2 and retain the IC package (not shown) in the insulative housing 2, and a fastener 6 for fastening the cover 3 on the PCB 1.

The PCB 1 has a first hole 11 at a first end and a pair of second holes 12 at a second end. The backplate 5 is located at a backside of the PCB 1 and has a first retaining hole 51 (threads thereof is not shown) corresponding the first hole 11 and a pair of second retaining holes 52 (threads thereof is not shown) corresponding to the second holes 12 of the PCB 1.

The insulative housing 2 is configured to a rectangle shape and the contacts 6 are received in the insulative housing 2 for electrically contacting with the IC package (not shown) and the PCB 1. The insulative housing 2 has a bottom wall 21 and four sidewalls 22 extending upwardly from the bottom wall 21, and the bottom wall 21 and the sidewalls 22 cooperatively define a receiving cavity 23 for accommodating the IC package (not shown). A plurality of passageways 25 are disposed on the bottom wall 21 for receiving the contacts 6. Two opposite widthwise sidewalls 22, substantially parallel to the holder 3, correspondingly define a pair of cutouts 24 for facilitating to pick up the IC package (not shown) from the insulative housing 2.

The holder 4 is mounted on the PCB 1 and beside the insulative housing 2. The holder 4 is substantially U-shaped and includes a pair of opposite ear portions 41 at two ends thereof and a recessed portion 42 between the two ear portions 41 and corresponding to the cutout 24 of the insulative housing 2. Each ear portion 41 defines a L-shaped slot 43 recessed from a top surface thereof and a through hole 44 adjacent the slot 43. The holder 4 further includes two retainers, such as bolts 45, which are received in the corresponding through holes 44 and pass through the second holes 12 of the PCB 1 and finally are screwed into the second retaining holes 52 of the backplate 5. Thus, the holder 4 is reinforced on the PCB 1 by the backplate 5.

The cover 3 is stamped from a metal piece and also in a U-shape. The cover 3 has a front edge 31 and two lateral edges 32 extending from two ends of the front edge 31, respectively. The lateral edges 32 are substantially perpendicular to the front edge 31, and the front edge 31 has a tongue 33 extending forwardly and defining a first through hole (not labeled) for receiving the fastener 6. Each lateral edge 32 has an orthogonal pivotal portion 34 bent from a free end thereof, which is contained into the corresponding slot 43 of the holder 4 to pivotally assemble the cover 3 to the holder 4 to cover the insulative housing 2. Moreover, top edges of the pivotal portions 34 are restrained by heads of the two bolts 45, respectively. Thus, when the cover 3 is rotated, stresses produced by the pivotal portions 34 are shared by the two bolts 45.

Figure 3:
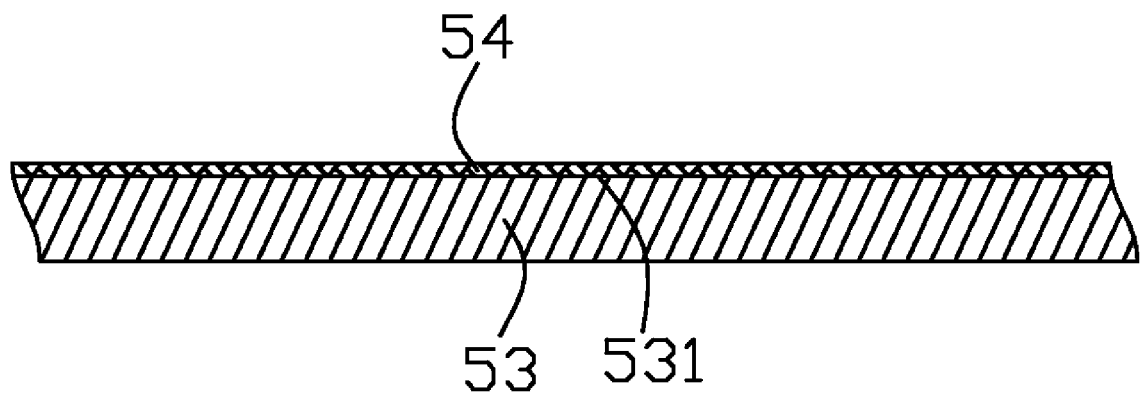
FIG. 3 is an enlarged and partial cross-view of a backplate of the electrical connector assembly shown in FIG. 1.
Figure 4:
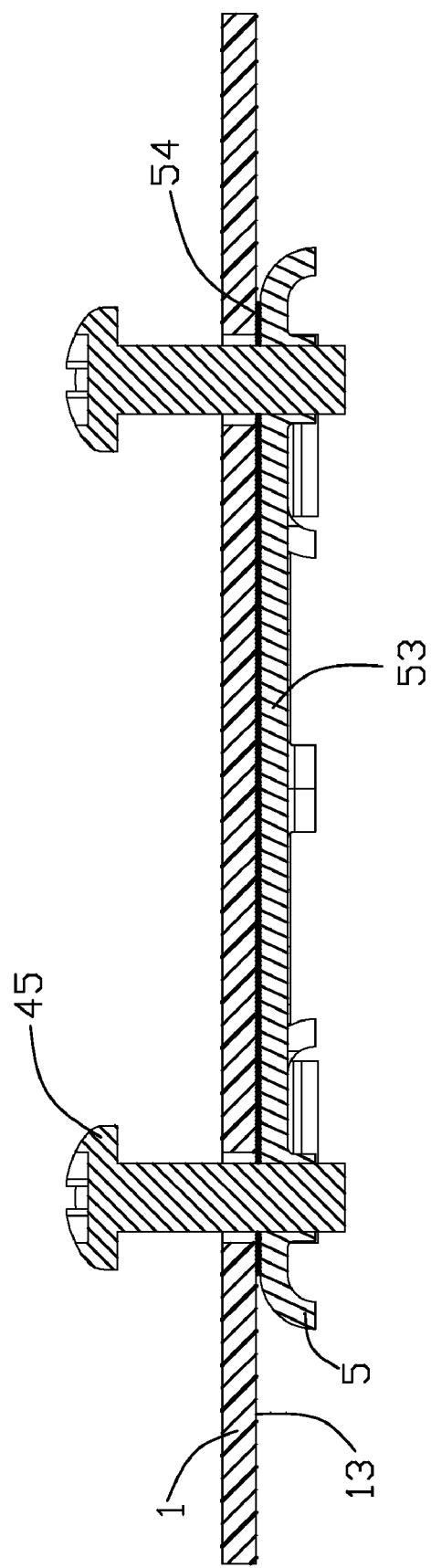
FIG. 4 is a cross-view of the backplate mounted on a printed circuit board.

Please referring to FIGS. 3 and 4, the backplate 5 is mounted to a backside surface 13 of the PCB 1 by the bolts 45 and the fastener 6. The backplate 5 includes a metallic base plate 53, which has an upper surface 531 towards the backside surface 13 of the PCB 1. An insulative coating 54 is deposited onto the upper surface 531 of the base plate 53 so as to prevent the backplate 5 from short-circuiting electrical components (not shown) mounted on the backside surface 13 of the PCB 1. Material of the insulative coating 54 can be selected from: acrylic resin, epoxy resin, fluoropolymer, polyester resin, phenolic resin, alkyd resin, silicon resin and unsaturated polyester resin, and one or more, and thickness of the insulative coating 54 is not more than 25 micrometer. Furthermore, the insulative coating 54 can be disposed on the upper surface 531 of the base plate 53 by the following methods: electrodeposition, dip coating, spray coating or electrostatic powder coating. It is noted that different from the normal insulative coating upon the metal piece which may be exposed upon an exterior under a relaxed manner, in the instant invention the insulative coating 54 of the backplate 5 is hidden in an interface between the backplate 5 and the printed circuit board 1 under pressure. Therefore, the thickness of the insulative coating 54 is preferably around 25 micrometer in a viewpoint from a critical balance between material saving/manufacturing simplicity and usage-wearing.

Turning now to FIGS. 1 and 4, when the electrical connector assembly 100 is assembled, the holder 4 and the backplate 5 are mounted two opposite sides of the PCB 1 by the bolts 45, then the cover 3 is pivotally mounted on the holder 4 and can be operated to open or close. Firstly, the cover 3 is open, the IC package (not shown) is seated in the receiving cavity 23 of the insulative housing 2, and then the cover 3 is close and cover an upper surface of the IC package (not shown). Finally, the fastener 6 passes through the tongue 33 of the cover 3 and the PCB 1 to be secured in the first retaining hole 51 of the backplate 5, so as to lock the cover 3.

From the foregoing content, it will be seen that, since the insulative coating 54 is directly deposited on the upper surface 531 of the base plate 53 to form the whole backplate 5, it is easy to assemble the backplate 5, and time for assembling is effectively reduced. In addition, the insulative coating 54 of the backplate 5 is more abrasive resistant than an individual insulative layer or film.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector assembly, comprising:
   a printed circuit board;
   an insulative housing mounted upon the printed circuit board and having a receiving cavity for accommodating an IC package;
   a plurality of contacts disposed in the insulative housing;
   a retention module secured on the printed circuit board for restraining the IC package located in the receiving cavity of the insulative housing; and
   a backplate mounted below the printed circuit board, comprising a metallic base plate having a surface towards a backside surface of the printed circuit board and an insulative coating deposited onto the surface of the base plate so as to prevent the backplate from short circuiting electrical components mounted on the backside surface of the printed circuit board;
   wherein the retention module includes an insulative holder having L-shaped slots mounted on the printed circuit board and beside a front end of the insulative housing, a metal cover with pivot portions pivotally mounted in the L-shaped slots of the holder from an open position and a close position, and a fastener securing the cover to the printed circuit board in the close position;
   wherein the holder further includes two through holes at two ends thereof and two retainers received in the corresponding through holes, the two retainers and the fastener are fastened into corresponding retaining holes in the backplate after passing through the printed circuit board; and wherein thickness of the insulative coating is not more than 25 micrometer.

2. The electrical connector assembly as claimed in claim 1, wherein material of the insulative coating is selected from a group consisting of acrylic resin, epoxy resin, fluoropolymer, polyester resin, phenolic resin, alkyd resin, silicon resin and unsaturated polyester resin.

3. An electrical connector assembly comprising:

a printed circuit board defining opposite first and second surfaces;

an insulative housing mounted on the first surface and equipped with a plurality of contacts therein for receiving and contacting an electronic package;

an insulative header having L-shaped slots mounted on the first surface and located by one end of the housing;

a metallic cover at one end having pivot portions pivotally mounted in the L-shaped slots of the header and being mounted on the housing at one end and the other end of the metallic cover being screwed to the printed circuit board by a fastener; and a metallic backplate seated upon the second surface and tightly screwed to the printed circuit board from the first surface therefrom;

wherein an insulative coating is applied to the metallic backplate and being positioned between the backplate and the printed circuit board under condition that said insulative coating defines a thickness around 25 micrometer;

wherein the header further includes two through holes at two ends thereof and two retainers received in the corresponding through holes, the two retainers and the fastener are fastened into corresponding retaining holes in the metallic backplate after passing through the printed circuit board.

\* \* \* \* \*